US008830779B1

United States Patent
Terzioglu et al.

(10) Patent No.: US 8,830,779 B1
(45) Date of Patent: Sep. 9, 2014

(54) LOW VOLTAGE FUSE-BASED MEMORY WITH HIGH VOLTAGE SENSE AMPLIFIER

(71) Applicant: QUALCOMM Incorporated, San Diego, CA (US)

(72) Inventors: Esin Terzioglu, San Diego, CA (US); Gregory Ameriada Uvieghara, Murrieta, CA (US); Sei Seung Yoon, San Diego, CA (US); Balachander Ganesan, Mountain View, CA (US); Anil Chowdary Kota, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/924,916

(22) Filed: Jun. 24, 2013

(51) Int. Cl.
G11C 17/18 (2006.01)
G11C 7/06 (2006.01)

(52) U.S. Cl.
CPC .................................... G11C 7/065 (2013.01)
USPC .................. 365/225.7; 365/189.07; 365/96; 365/189.08; 365/189.09

(58) Field of Classification Search
CPC .... G11C 13/004; G11C 7/14; G11C 11/4099; G11C 2211/5634
USPC ............................................... 365/225.7, 203
See application file for complete search history.

(56) References Cited

U.S. PATENT DOCUMENTS

| 7,098,721 | B2 | 8/2006 | Ouellette et al. |
| 7,936,582 | B1 | 5/2011 | Zhou et al. |
| 7,944,766 | B2 | 5/2011 | Senou |
| 2006/0152990 | A1* | 7/2006 | Huang ........................ 365/225.7 |
| 2012/0243342 | A1 | 9/2012 | Lee et al. |
| 2013/0016572 | A1 | 1/2013 | Kuroda |

* cited by examiner

Primary Examiner — Hoai V Ho
Assistant Examiner — Muhammad Islam
(74) Attorney, Agent, or Firm — Haynes and Boone, LLP

(57) ABSTRACT

A fuse-based memory includes a plurality of bit lines. Each bit lines couples to a corresponding plurality of fuses. The fuses couple to ground through corresponding access transistors. The memory is configured to precharge an accessed one of the bit lines and a reference one of the bit lines using a low voltage supply. In contrast, a resulting voltage difference between the accessed bit line and the reference bit line is sensed using a sense amplifier powered by a high voltage supply, wherein a high voltage supplied by the high power supply is greater than a low voltage supplied by the low voltage supply.

20 Claims, 3 Drawing Sheets

LOW VOLTAGE FUSE-BASED MEMORY WITH HIGH VOLTAGE SENSE AMPLIFIER

TECHNICAL FIELD

This application relates to fuse-based memories, and more particularly to a fuse-based memory having bit lines precharged with a low voltage supply and sensed by a sense amplifier powered by a high voltage supply.

BACKGROUND

Non-volatile memories are commonly incorporated in integrated circuits such as an application processor for mobile devices. For example, a non-volatile memory such as a fuse-based memory may be used to configure a device with an encryption code, adaptations for specific process corners, wafer coordinates, e-commerce data, JTAG security modes, and so on. The memory cell in a fuse-based memory comprises a conductor that can be programmed by "burning" the fuse with sufficiently high current. The value for the stored bit in a memory cell depends upon whether the memory cells's fuse is programmed to be non-conducting or remains conducting. Reading the resulting stored value in a memory cell thus comprises determining the resistance of the memory cell's fuse to determine whether or not it has been programmed. Despite the wide usage of fuse-based non-volatile memories, problems remain with their design.

A first problem concerns the amount of current driven through a fuse during a read operation. In particular, reading the programmed state of a fuse typically involves determining the degree to which a fuse will discharge a precharged bit line to ground. If the fuse is non-programmed (relatively low resistance) and it is coupled between ground and the precharged bit line, the charged bit line will discharge towards ground relatively rapidly. But if the fuse has been programmed (commonly referred to as being "burned") so as to have a high resistance, the pre-charged bit line cannot discharge so quickly. A precharged bit line coupled to a programmed fuse will thus maintain a relatively high voltage whereas the voltage on a precharged bit line coupled to a non-programmed fuse will be pulled towards ground. A sense amplifier compares the voltage on an accessed fuse's pre-charged bit line to a reference bit line voltage to read the fuse state. But the current driven through a fuse from a precharged bit line during a read operation must be carefully controlled. If too much current is applied, a non-programmed fuse may become programmed. Conversely, limiting the current too much increases the read access time to unacceptable levels because it takes a relatively long time for a non-programmed fuse passing a limited amount of current to pull its precharged bit line towards ground.

Limiting the current during a read operation while not suffering from unacceptable long read access times is not the only issue for fuse-based non-volatile memories. In addition, the sense amplifier must be properly timed to sense the bit lines voltages at an appropriate time. The proper timing of the sense amplifier will vary depending upon variations in the process corner, voltage supply levels, and temperature. Conventional fuse-based non-volatile memories are not robust to these variations.

Accordingly, there is a need in the art for improved fuse-based non-volatile memories in which the fuse states can be safely sensed while minimizing the access time despite process corner, voltage supply level, and temperature variations.

SUMMARY

An improved fuse-based memory is disclosed having faster read access times through the use of thick gate-oxide transistors in the sense amplifier, which is powered by a relatively high voltage supply. The sense amplifier can thus rapidly make a bit decision so that read access times are minimized. The bit lines and the associated fuses and their access transistors for the fuse-based memory comprise thin gate-oxide devices powered by a relatively low power supply voltage. In this fashion, a read operation does not subject an accessed fuse to excessive currents since its corresponding bit line is precharged to only a relatively low voltage from a low voltage power supply.

In addition, the triggering of a sense operation by the sense amplifier occurs responsive to a tracking circuit that includes a dummy bit line that models the electrical behavior of the accessed fuse's bit line. In this fashion, the triggering of the sense operation is immune to process, temperature, and voltage variations because these variations are substantially the same for the bit lines and the tracking circuit.

DETAILED DESCRIPTION

Figure 1:
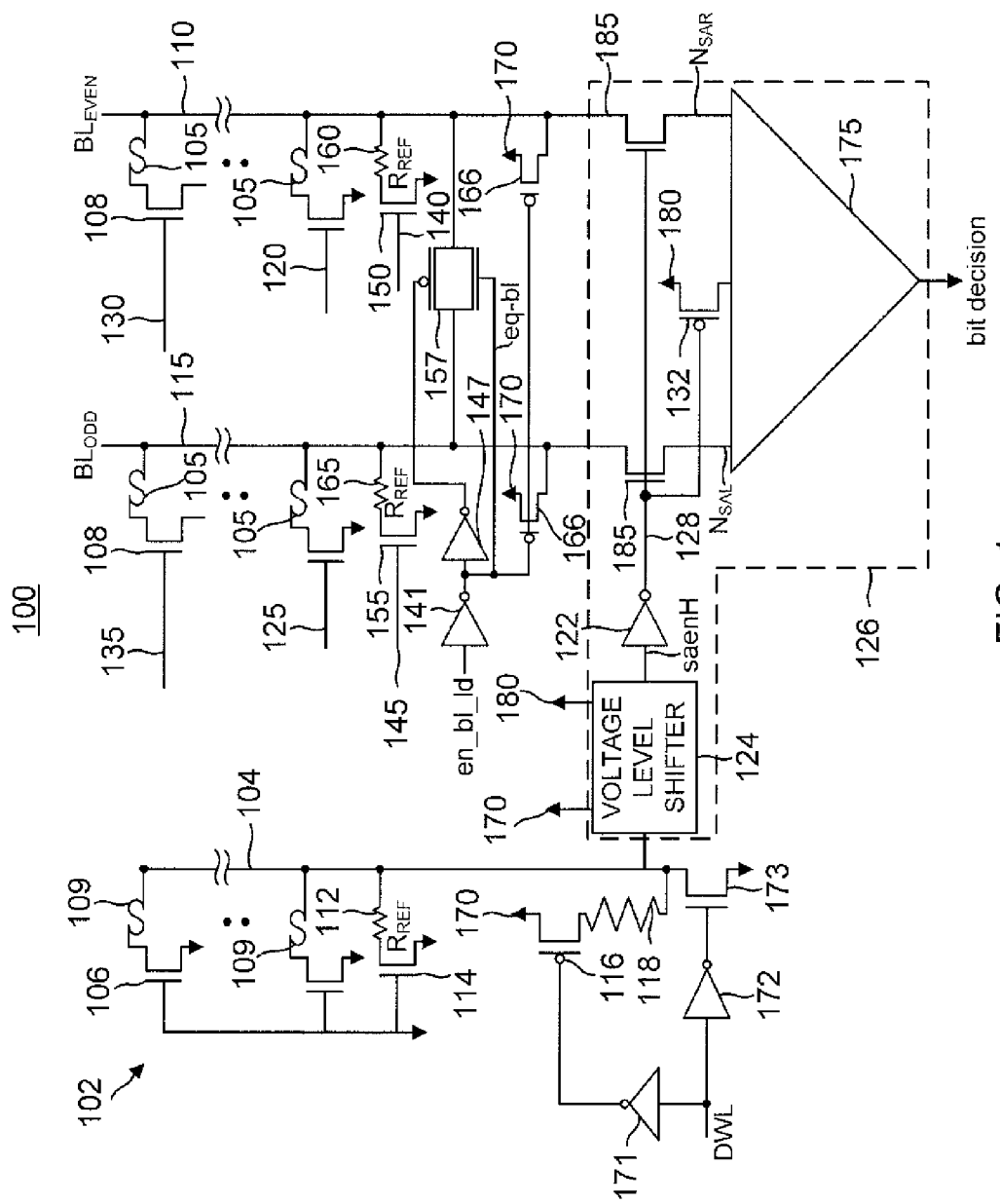
FIG. 1 is a schematic diagram of an example fuse-based memory.

A fuse-based memory is provided that achieves reduced read access times yet does not expose the accessed fuses to excessive current. To protect an accessed fuse from excessive current, its bit line is precharged to a relatively low voltage from a low voltage supply. In contrast, a sense amplifier is powered by a relatively high voltage from a high voltage supply so that the sense amplifier has high gain and can rapidly make a bit decision for an accessed fuse that is discharging a precharged bit line towards ground. The precharged bit line for an accessed fuse is referred to herein as the accessed bit line. The sense amplifier amplifies a voltage difference between the accessed bit line voltage and a reference bit line voltage on a precharged reference bit line that discharges through a reference resistor towards ground. The reference resistor has a resistance that lies between the relatively high resistance of a programmed fuse and the relatively low resistance of a non-programmed fuse. The voltage that develops on a precharged reference bit line coupled to ground through a reference resistor is thus less than the voltage that develops on a precharged bit line coupled to ground through a programmed fuse but is greater than the voltage that develops on a precharged bit line coupled to ground though a non-programmed fuse.

The sense amplifier is configured to make a bit decision by amplifying the voltage difference between an accessed bit line and a reference bit line responsive to an assertion of a sense enable signal by a tracking circuit to determine whether the accessed bit line voltage is lower or higher than the reference bit line voltage. Prior to the triggering of the bit decision by the sense enable signal, the sense amplifier has a first internal node coupled to the accessed bit line and a second internal node coupled to the reference bit line. The first internal node will thus have a voltage equaling the accessed bit line voltage whereas the second internal node will have a voltage equaling the reference bit line voltage. In response to the sense enable signal, the relatively high gain of the sense amplifier will pull the internal node having the higher voltage to the high voltage from the high voltage supply whereas the internal node having the lower voltage is pulled towards ground. The accessed bit line and reference bit lines are thus isolated through switches from their respective internal nodes in the sense amplifier responsive to the sense enable signal so as to protect their associated devices from the high voltage used by the sense amplifier. Not only does this protect the bit line devices, it also isolates the relatively large capacitance of the accessed bit line and reference bit line from the smaller capacitance of the respective internal nodes of the sense amplifier. In this fashion, the sense amplifier need not fight the high capacitance of the accessed bit line and reference bit line while it amplifiers the voltage difference between the internal nodes, which results in even faster read access times. These and other advantage may be better appreciated with reference to the following example embodiments.

EXAMPLE EMBODIMENTS

Turning now to the drawings, FIG. 1 shows an example fuse-based memory 100. Fuses 105 are arranged in rows and columns. Each column has an even bit line and an odd bit line. For illustration clarity, only a single column is shown, which comprises an even bit line 110 and an odd bit line 115. Fuses 105 may thus be classified as even fuses or odd fuses depending upon which type of bit line they are coupled to. Analogous to the columns, each row comprises an odd word line and an even word line. The rows are arranged from a first row to a last row. A first row includes an even first word line 120 and an odd first word line 125. Similarly, a last row comprises an even last word line 130 and an odd last word line 135.

The address of a bit stored in memory 100 determines whether it corresponds to an even or odd fuse. In one embodiment, if the least significant bit (LSB) of the address is a 0, the address corresponds to an even fuse. Similarly, if the LSB equals 1 in such an embodiment, the address corresponds to an odd fuse. Each fuse 105 couples to ground through a corresponding access transistor 108. Depending upon whether fuse 105 is odd or even, the gate of the corresponding access transistor 108 couples to an odd or even word line. In a read operation, the non-accessed bit line in the accessed column acts as a reference line. Thus, if even bit line 110 is the accessed bit line, odd bit line 115 acts as the reference bit line. Conversely, if odd bit line 115 is accessed, even bit line 110 acts as the reference bit line. A bit line in an accessed column thus either operates either as an accessed bit line or a reference bit line depending upon whether an even or odd value is being addressed. As used herein, a column is deemed to be "accessed" if a read operation addresses a fuse in the column. Similarly, a bit line is deemed to be "accessed" if a read operation addresses a fuse couple to the bit line.

When even bit line 110 acts as a reference bit line, a voltage asserted on an even reference word line 140 drives the gate of an even reference access transistor 150 that couples between ground and a reference resistor 160 that in turn couples to even bit line 110. Similarly, when odd bit line 115 acts as a reference bit line, a voltage asserted on an odd reference word line 145 drives the gate of an odd reference access transistor 155 that couples between ground and a reference resistor 165 that in turn couples to odd bit line 115. During a read operation for memory 100, even and odd bit lines 110 and 115 are precharged through corresponding PMOS load transistors 166 that couple between their bit lines and a low voltage supply 170. The programmed or non-programmed state of a fuse will control how much voltage can be developed on the accessed bit line, which can then be compared to the voltage developed on the reference bit line.

To provide optimal timing for the triggering of a sense amplifier 175, a tracking circuit 102 includes a dummy bit line 104. Dummy bit line 104 is electrically matched to bit lines 115 and 110. Thus, dummy bit line 104 includes the same number of dummy fuses 109 as fuses 105 for bit lines 115 or 110. To further match the loading, dummy fuses 109 are coupled to dummy access transistors 106 that are matched to access transistors 108. However, since dummy bit line 104 is merely used for timing purposes, the gates of dummy word line transistors 106 are grounded. To further match the loading, a dummy reference resistor 112 matched to reference resistors 160 and 165 couples to dummy bit line 104 and a dummy reference access transistor 114. Dummy reference access transistor is matched to reference access transistors 155 and 150. Given this matching, the electrical characteristics of dummy bit line 104 are the same or substantially the same as for bit lines 110 and 115. For example, regardless of the particular process corner, that process corner is the same for dummy bit line 104 as it is for bit lines 110 and 115. Similarly, variations in voltage level are the same for dummy bit line and for bit lines 110 and 115 as are the variations in temperature. Memory 100 is thus robust to these variations.

To generate a sense enable signal for triggering the sense operation by sense amplifier 175, tracking circuit 102 includes a voltage level shifter 124 that shifts a voltage that develops on dummy bit line 104 into the high voltage domain to form a sense amplifier enable high voltage signal (saenH). For example, if the dummy bit line voltage had risen to the low voltage from low voltage supply 170, voltage level shifter 124 would level shift this low voltage into the high voltage from a high voltage supply 180. A voltage level shifter 124 is thus powered by both low voltage supply 170 as well as high voltage supply 180. An inverter 122 inverts the saenH signal to form an active low sense enable signal 128. Tracking circuit 102 thus serves as a means for triggering a sense operation by sense amplifier 175. The high voltage from high voltage supply 180 is such that voltage level shifter 124 and inverter 122 comprise thick gate-oxide devices that can withstand such a voltage level. In contrast, the remainder of tracking circuit 102 comprises thin gate-oxide devices since they are exposed to only the tower voltage from low voltage supply 170. Similarly, the remaining devices in memory 100 comprise thin gate-oxide devices besides those devices in a high-voltage domain 126 that includes voltage level shifter 124 and inverter 122.

Figure 2:
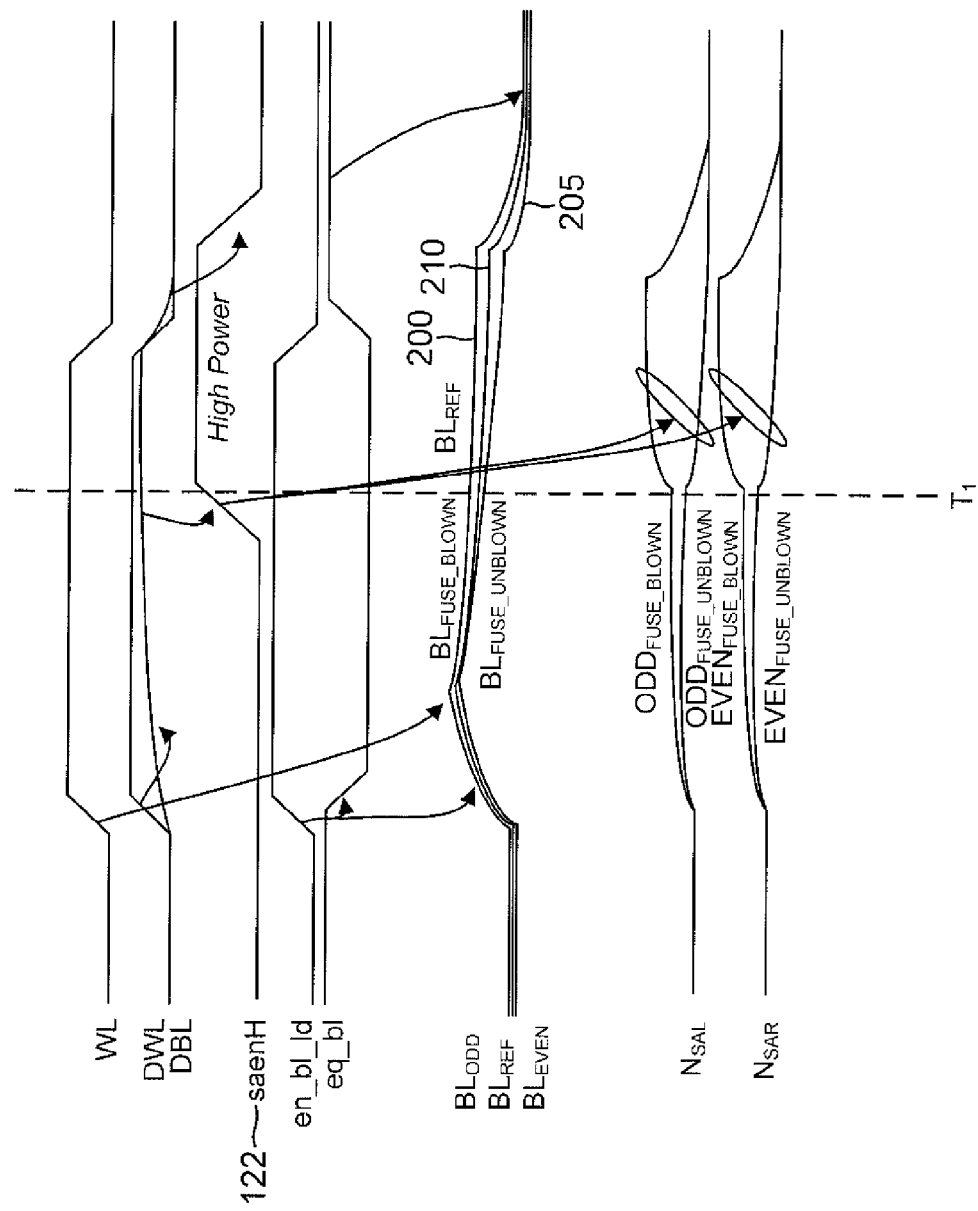
FIG. 2 is a timing diagram for signals within memory 100 during a read operation.

FIG. 2 is a timing diagram for the resulting bit line voltages and other signals in memory 100 during a read operation. A voltage WL represents the voltage on a word line, which may be the voltage on either an even word line or an odd word line since both instances are represented in FIG. 2. However, it will be appreciated that only one word line (odd or even) is asserted in any given read operation. Should WL be the voltage on an odd word line, it is assumed for the sake of demonstration that the odd word line drive the access transistor to a programmed (blown) odd fuse. Similarly, it is also assumed that the even word line drives the access transistor to a non-programmed (unblown) even fuse.

Prior to the assertion of voltage WL, a bit line enable signal (en_bl_ld) is asserted high from a default low state. An inverter 141 inverts the bit line enable signal to form a signal eq_bl that drives an inverter 147 and PMOS load transistors 166. PMOS load transistors 166 thus precharge the accessed bit line and the reference bit line prior to the assertion of the word line voltage WL. Inverter 147 drives the PMOS side of a transmission gate 157 that couples bit lines 110 and 115 together in a default (no read operation state). Signal eq_bl drives the NMOS side of transmission gate 157. Transmission gate 157 is thus conducting during a default state and is non-conducting during a read operation. The simultaneous assertion of signal en_bl_ld and de-assertion of eq_bl is shown in FIG. 2, which begins the precharging of the odd (or even) bit line and the reference bit line. Referring again to FIG. 1, bit lines 110 and 115 are grounded though respective switches (not illustrated) in the default state that are switched off in response to the assertion of bit line enable signal 143.

A reference word line voltage (not illustrated in FIG. 2) also goes high simultaneously with word line voltage WL. In response to the assertion of the word line and reference word line voltages, the access transistor for the accessed bit line as well as the reference access transistor for the reference bit line are switched on so that the accessed bit line voltage and reference bit line voltage ($BL_{REF}$) begin to drop. In this example, the odd bit line voltage $BL_{ODD}$ 200 in FIG. 2 represents the accessed bit line voltage for a programmed fuse and thus stays higher than the reference bit line voltage $BL_{REF}$ 210. Similarly, because the even bit line voltage $BL_{EVEN}$ 205 in this example represents the accessed bit line voltage for a non-programmed fuse, the reference bit line voltage $BL_{REF}$ stays higher than $BL_{EVEN}$.

A dummy word line voltage DWL is asserted at the same time the word line voltage WL is asserted. Referring again to FIG. 1, tracking circuit 102 includes an inverter 171 that inverts DWL to drive the gate of a PMOS tracking transistor 116 in series with a tracking resistor 118. The source of PMOS tracking transistor 116 couples to low voltage supply 170 where tracking resistor 118 couples to dummy bit line 104. The assertion of dummy word line voltage DWL though its inversion in inverter 171 thus switches on tracking transistor 116, which begins to charge dummy bit line 104 through tracking resistors 118. As seen in FIG. 2, a dummy bit line voltage DBL thus begins to rise toward the low voltage level supplied by low voltage supply 170. DWL is also inverted by an inverter 172 that drives an NMOS transistor 173 that couples between dummy bit line 104 and ground. Dummy bit line 104 thus floats during a read operation and is otherwise grounded.

The size of tracking transistor 116 and a tracking resistance for tracking resistor 118 are selected such that sense enable signal 128 is not asserted until a time $T_1$ as shown in FIG. 2. This is the time when a sufficient separation has developed between the accessed bit line voltage and the reference bit line voltage such that the high-power amplification from sense amplifier 175 can reliably effect a bit decision. Signal saenH is asserted high when a tracking level has been reached for the dummy bit line voltage DBL at time $T_1$.

The resulting assertion of (active low) sense enable signal 128 drives a gate of a power switch PMOS transistor 132, which when switched on couples sense amplifier 175 to high voltage supply 180 so that it may begin a sense operation. Sense enable signal 128 also drives the gates of isolation transistors 185 so as to isolate sense amplifier 175 from bit lines 110 and 115. Prior to the isolation, a first internal node $N_{SAL}$ for sense amplifier 175 is charged by odd bit line 115. Similarly, a second internal node $N_{SAR}$ is charged by even bit line 110. The relatively small difference between the voltages on these nodes at time $T_1$ is accommodated by the large gain provided by sense amplifier 175 given that it resides in high voltage domain 126n as shown in FIG. 2. The transistors in high voltage domain 126 are thus relatively large, thick gate-oxide devices. In contrast, the remaining transistors in memory 100 are relatively small, thin gate-oxide devices. In this fashion, memory 100 has a low power consumption yet is fast because of the high gain from high-voltage-supplied sense amplifier 175. Moreover, sense amplifier 175 is reliably timed through tracking circuit 102 despite variations in process corner, voltage supply levels, and temperature. Note that bit lines 110 and 115 have a relatively large capacitance. In contrast, internal nodes $N_{SAL}$ and $N_{SAR}$ are low-capacitance nodes. Isolation transistors 185 thus function to shield sense amplifier 175 from the large bit line capacitance. Its large gain can thus quickly amplify the voltage difference between the low-capacitance internal nodes. Although the above discussion addresses a non-volatile fuse-based memory, it will be appreciated that the principles disclosed herein are widely applicable to other applications such as the sensing of resistances for circuit elements besides fuses.

To make fuses 105 robust to the currents that flow through them during a read operation, PMOS load transistors 166 are sufficiently sized and charged through low voltage supply 170. But such safe operation means that the difference between blown and unblown accessed bit line voltages 200 and 205 is relatively small as well. In a conventional memory, this is problematic in that access times must then be slowed down to allow a sufficient voltage difference to develop. But memory 100 solves this dilemma in that sense amplifier 175 is powered by a high voltage supply 180. Sense amplifier can thus quickly and reliably amplify the relatively small difference between the bit line voltages. An example method of use for memory 100 will now be addressed.

Example Method of Use

Figure 3:
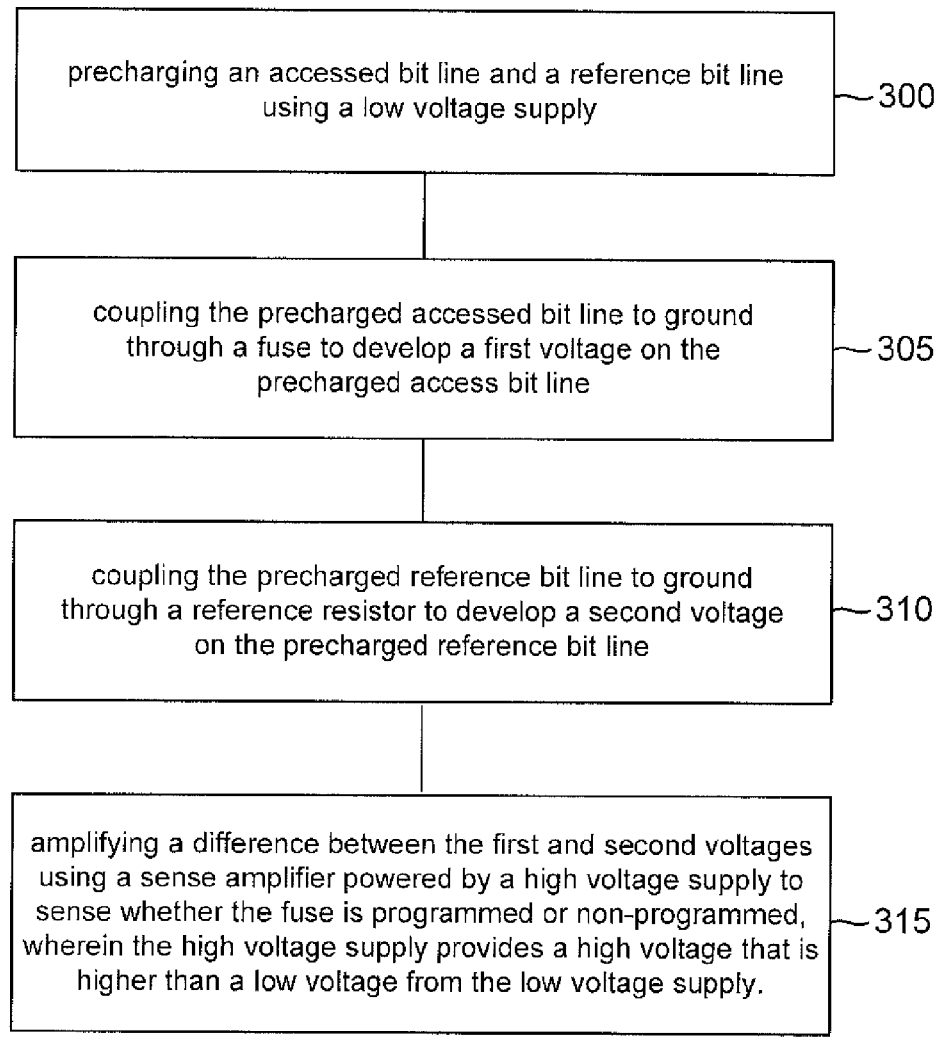
FIG. 3 is a flowchart for a method of operation for the fuse-based memory of FIG. 1.

A flowchart for an example method of use for the disclosed fuse-based memory is provided in FIG. 3. An initial step 300 comprises precharging an accessed bit line and a reference bit line using a low voltage supply. A step 305 comprises coupling the precharged accessed bit line to ground through a fuse to develop a first voltage on the precharged access bit line. A step 310 comprises coupling the precharged reference bit line to ground through a reference resistor to develop a second voltage on the precharged reference bit line. Finally, a step 315 comprises amplifying a difference between the first and second voltages using a sense amplifier powered by a high voltage supply to sense whether the fuse is programmed or non-programmed, wherein the high voltage supply provides a high voltage that is higher than a low voltage from the low voltage supply.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and, described herein, as they are merely by way of some examples thereof, but rather, should be fully commensurate with that of the claims appended hereafter and their functional equivalents.

What is claimed is:

1. A memory, comprising:
   a plurality of bit lines, each bit line coupled to a corresponding plurality of fuses;
   a sense amplifier configured to amplify a voltage difference between a voltage on an accessed one of the bit lines and a voltage on a reference one of the bit lines to determine a programmed state for one of the fuses coupled to the accessed bit line, wherein the sense amplifier is configured to be powered by a high voltage supply and the bit lines are configured to be precharged by a low voltage supply, the high voltage being greater than the low voltage; and
   a tracking circuit configured to develop a voltage on a dummy bit line configured to be electrically matched to each of the bit lines, wherein the sense amplifier is configured to amplify the voltage difference responsive to the dummy bit line voltage developing to a triggering level.

2. The memory of claim 1, wherein the bit lines are arranged into columns, each column comprising an odd one of the bit lines and an even one of the bit lines, wherein the fuses coupled to the even bit lines are even fuses and the fuses coupled to the odd bit lines are odd fuses.

3. The memory of claim 1, further comprising a plurality of access transistors for each bit line, wherein each fuse couples to ground through a corresponding one of the access transistors.

4. The memory of claim 1, further comprising:
a plurality of reference resistors corresponding to the plurality of bit lines; and
a plurality of reference access transistors corresponding to the plurality of reference resistors, wherein each reference access transistor couples between the corresponding reference resistor and ground.

5. The memory of claim 4, further comprising a plurality of reference word lines corresponding to the plurality of reference access transistors, each reference word line coupled to the gate of the corresponding reference access transistor.

6. The memory of claim 4, wherein each reference resistor has a resistance that is less than a programmed fuse resistance and greater than a non-programmed fuse resistance.

7. The memory of claim 1, wherein the tracking circuit is configured to assert a sense enable signal received by the sense amplifier responsive to the dummy bit line voltage developing to the triggering level.

8. The memory of claim 7, further comprising:
a first switch coupled between the accessed bit line and the sense amplifier; and
a second switch coupled between the reference bit line and the sense amplifier, wherein the first switch and the second switch are configured to isolate the sense amplifier from the accessed bit line and the reference bit line responsive to the assertion of the sense enable signal.

9. The memory of claim 1, wherein the tracking circuit further includes a tracking resistor coupled to the dummy bit line and a tracking transistor coupled between the tracking resistor and the low voltage supply, and wherein the tracking circuit is configured to develop the voltage on the dummy bit line using the tracking resistor and the tracking transistor.

10. The memory of claim 1, wherein the tracking circuit includes:
a plurality of dummy fuses coupled to the dummy bit line; and
a plurality of dummy access transistors corresponding to the plurality of dummy fuses, wherein each dummy access transistor couples between the corresponding dummy fuse and ground.

11. The memory of claim 10, wherein each dummy access transistor is an NMOS transistor having a grounded gate.

12. A method, comprising:
precharging an accessed bit line and a reference bit line using a low voltage supply;
coupling the precharged accessed bit line to ground through a fuse to develop a first voltage on the precharged accessed bit line;
coupling the precharged reference bit line to ground through a reference resistor to develop a second voltage on the precharged reference bit line; and
amplifying a difference between the first and second voltages using a sense amplifier powered by a high voltage supply to sense whether the fuse is programmed or non-programmed, wherein the high voltage supply provides a high voltage that is higher than a low voltage from the low voltage supply.

13. The method of claim 12, further comprising:
coupling a dummy bit line to the low voltage supply through a tracking resistor to develop a voltage on the dummy bit line; and
responsive to the voltage on the dummy bit line exceeding a threshold voltage, asserting a sense enable signal, wherein the amplifying the difference between the first and second voltages using the sense amplifier occurs responsive to the assertion of the sense enable signal.

14. The method of claim 13, further comprising isolating the sense amplifier from the accessed bit line and the reference bit line responsive to the assertion of the sense enable signal.

15. The method of claim 13, further comprising asserting a voltage on a dummy word line while simultaneously asserting a voltage on a word line, wherein coupling the accessed bit line to ground occurs responsive to the assertion of the voltage on the word line.

16. The method of claim 15, wherein coupling the dummy bit line to the low voltage supply occurs responsive to the assertion of the voltage on the dummy word line.

17. A memory, comprising:
a plurality of bit lines, each bit line coupled to a corresponding plurality of fuses;
a sense amplifier configured to amplify a voltage difference between a voltage on an accessed one of the bit lines and a voltage on a reference one of the bit lines to determine a programmed state for one of the fuses coupled to the accessed bit line, wherein the sense amplifier is configured to be powered by a high voltage supply and the bit lines are configured to be precharged by a low voltage supply, the high voltage being greater than the low voltage; and
means for asserting a sense enable signal to trigger the amplification of the voltage difference by the sense amplifier.

18. The memory of claim 17, wherein the means includes a voltage level shifter for shifting a first voltage developed on a dummy bit line by the low voltage supply into a second voltage developed by the high power supply.

19. The memory of claim 17, wherein the sense amplifier comprises thick gate-oxide transistors.

20. The memory of claim 17, further comprising:
a first switch coupled between the accessed bit line and the sense amplifier; and
a second switch coupled between the reference bit line and the sense amplifier, wherein the first switch and the second switch are configured to isolate the sense amplifier from the accessed bit line and the reference bit line responsive to the assertion of the sense enable signal.

* * * * *